US011380559B2

(12) United States Patent
Eto et al.

(10) Patent No.: US 11,380,559 B2
(45) Date of Patent: Jul. 5, 2022

(54) CARRIER DEVICE, WORK PROCESSING APPARATUS, CONTROL METHOD OF CARRIER DEVICE AND STORAGE MEDIUM STORING PROGRAM

(71) Applicants: EBARA CORPORATION, Tokyo (JP); HIRATA CORPORATION, Kumamoto (JP)

(72) Inventors: Yohei Eto, Tokyo (JP); Junji Kunisawa, Tokyo (JP); Teruaki Hombo, Tokyo (JP); Keiji Kanazawa, Kumamoto (JP)

(73) Assignees: EBARA CORPORATION, Tokyo (JP); HIRATA CORPORATION, Kumamoto (JP)

( * ) Notice: Subject to any disclaimer, the term of this patent is extended or adjusted under 35 U.S.C. 154(b) by 84 days.

(21) Appl. No.: 16/842,974

(22) Filed: Apr. 8, 2020

(65) Prior Publication Data
US 2020/0328096 A1    Oct. 15, 2020

(30) Foreign Application Priority Data

Apr. 9, 2019    (JP) .............................. JP2019-074397

(51) Int. Cl.
*H01L 21/67* (2006.01)
*H01L 21/677* (2006.01)
*H01L 21/687* (2006.01)

(52) U.S. Cl.
CPC .. *H01L 21/67017* (2013.01); *H01L 21/67173* (2013.01); *H01L 21/67706* (2013.01); *H01L 21/68707* (2013.01)

(58) Field of Classification Search
CPC .......... F25D 21/04; F26B 15/00; B25B 5/087; B25J 15/0253; B29C 2945/76498
(Continued)

(56) References Cited

U.S. PATENT DOCUMENTS 5,324,155 A * 6/1994 Goodwin ................. B25J 9/107
294/64.3
5,928,390 A    7/1999 Yaegashi et al.
(Continued)

FOREIGN PATENT DOCUMENTS

JP    H09-131680 A    5/1997
JP    3342803 B2    11/2002
(Continued)

OTHER PUBLICATIONS

Japanese Office action issued in Japanese Patent Application No. 2019-074397 dated Mar. 3, 2021.

*Primary Examiner* — Ronald P Jarrett
(74) *Attorney, Agent, or Firm* — Pearne & Gordon LLP

(57) ABSTRACT

An object is to suppress dew condensation in a carrier device. There is provided a carrier device comprising a body; a rotational part provided to be rotatable relative to the body; an arm supported on the rotational part; an end effector provided in a leading end portion of the arm and configured to hold a work; a gas supply unit configured to supply a gas to an arm-side internal space provided in an arm-side base portion of the end effector and/or in the leading end portion of the arm; and an exhaust unit provided in a body-side internal space that communicates with the arm-side internal space and configured to discharge the gas in the arm-side internal space and/or in the body-side internal space.

18 Claims, 7 Drawing Sheets

(58) Field of Classification Search
USPC ............................... 294/103.1, 207; 700/203
See application file for complete search history.

(56) References Cited

U.S. PATENT DOCUMENTS

| | | | | |
|---|---|---|---|---|
| RE43,334 E | * | 5/2012 | Simmons | B67D 1/0032 |
| | | | | 239/63 |
| 10,363,665 B2 | * | 7/2019 | Hosek | B25J 11/0095 |
| 10,816,259 B2 | * | 10/2020 | Suzuki | H01L 21/68728 |
| 2007/0216179 A1 | * | 9/2007 | Hirooka | H01L 21/68707 |
| | | | | 294/103.1 |
| 2016/0288032 A1 | * | 10/2016 | Shite | H01L 21/67017 |

FOREIGN PATENT DOCUMENTS

| | | | |
|---|---|---|---|
| JP | 3638393 B2 | 4/2005 |
| JP | 3983481 B2 | 9/2007 |
| JP | 6120031 B2 | 4/2017 |

\* cited by examiner

CARRIER DEVICE, WORK PROCESSING APPARATUS, CONTROL METHOD OF CARRIER DEVICE AND STORAGE MEDIUM STORING PROGRAM

The present application claims priority from the Japanese patent application No. 2019-074397 filed on Apr. 9, 2019. The entire disclosure of the Japanese patent application No. 2019-074397 filed on Apr. 9, 2019, including specification, claims, drawings and summary is incorporated herein by reference in its entirety. The entire disclosure of Japanese Patent No. 3342803, Japanese Patent No. 3638393, Japanese Patent No. 3983481, and Japanese Patent No. 6120031 is incorporated herein by reference in its entirety.

TECHNICAL FIELD

The present disclosure relates to a carrier device, a work processing apparatus, a control method of the carrier device and a storage medium that stores a program therein.

BACKGROUND ART

In a work processing apparatus configured to process a work (or a substrate or a wafer) such as a semiconductor wafer or in a component inspection apparatus for any of various devices such as a semiconductor device, a carrier device such as a transfer robot is used to convey a work in the apparatus. Various configurations are employed for such a carrier device with a view to performing stable conveyance, processing and/or inspection of the work. Japanese Patent No. 3342803 (Patent Document 1) describes a configuration that an inlet port configured to introduce the clean air and a movable slit window configured to adjust the amount of the introduced air are provided on an upper surface of a cylindrical support body configured to place a wafer carrier body therein. Japanese Patent No. 3638393 (Patent Document 2) describes a configuration that inside of a transfer chamber which a substrate is carried in and carried out, a conveyance chamber with a conveyance mechanism placed therein and a processing chamber where the substrate is subjected to a predetermined process, is kept in advance under reduced pressure or is purged with an inert gas under atmospheric pressure or under sub-atmospheric pressure so as to be kept in a clear atmosphere. Japanese Patent No. 3983481 (Patent Document 3) describes a configuration that a case body with an arm placed therein is provided with a gas supply portion and that a gas is supplied from the gas supply portion to a wafer holding area of the arm to regulate an atmosphere for a wafer conveyed. Japanese Patent No. 6120031 (Patent Document 4) describes a configuration that supplies the dry air into an arm box which a sucking portion configured to suck a device and a vertical moving arm configured to move up and down the sucking portion are placed in, so as to suppress dew condensation on the surface of the device.

RELATED ART DOCUMENT

Patent Document

Patent Document 1: Japanese Patent No. 3342803
Patent Document 2: Japanese Patent No. 3638393
Patent Document 3: Japanese Patent No. 3983481
Patent Document 4: Japanese Patent No. 6120031

SUMMARY OF INVENTION

In a CMP apparatus that is one example of the work processing apparatus, in the case of cleaning a substrate after a polishing process, the substrate in a wet state is conveyed to a cleaning module by a transfer robot, with a view to suppressing fixation of slurry. In this case, the transfer robot is operated in a wet environment and is accordingly exposed to a high humidity environment. A high sealing structure, for example, a sealing mechanism/sealing member configured to prevent invasion of water and the high humidity air into the transfer robot, is employed for the transfer robot to achieve stable conveyance of the substrate in the wet environment. There is, however, still a possibility that the high humidity air enters inside of the transfer robot through a narrow gap in a part where the sealing mechanism/sealing member is provided. In the case where the sealing mechanism has any trouble or failure or in the case where the sealing property is reduced due to time degradation of the sealing member or the like, inside of the transfer robot is likely to become the state of high humidity. As a result, there is a possibility of dew condensation inside of the transfer robot. The dew condensation is likely to cause problems, such as corrosion of an internal component and detection error of a sensor. This makes it difficult to stably convey the substrate by the transfer robot, while shortening the service life of the transfer robot or increasing the frequency of inspection and maintenance required.

Such problems are not limited to the transfer robot configured to perform conveyance to the cleaning module in the CMP apparatus but are likely to occur in any other carrier device that performs conveyance in a wet environment.

An object of the present disclosure is to solve at least part of the problems described above.

According to one aspect of the present disclosure, there is provided a carrier device comprising a body; a rotational part provided to be rotatable relative to the body; an arm supported on the rotational part; an end effector provided in a leading end portion of the arm and configured to hold a work; a gas supply unit configured to supply a gas to an arm-side internal space provided in an arm-side base portion of the end effector and/or in the leading end portion of the arm; and an exhaust unit provided in a body-side internal space that communicates with the arm-side internal space and configured to discharge the gas in the arm-side internal space and/or in the body-side internal space.

According to another aspect of the present disclosure, there is provided a control method of a carrier device of a work. The carrier device comprises a body; a rotational part provided to be rotatable relative to the body; an arm supported on the rotational part; and an end effector provided in a leading end portion of the arm and configured to hold a work. The control method comprises a gas supply process of supplying a gas to an arm-side internal space provided in an arm-side base portion of the end effector and/or in the leading end portion of the arm; a supply amount control process of controlling a supply amount of the gas that is to be supplied to the arm-side internal space; and an exhaust process of discharging the gas in the arm-side internal space and/or a body-side internal space. The supply amount control process comprises a control process of performing on/off control of a supply of the gas to the arm-side internal space and/or control of the supply amount of the gas to the arm-side internal space, according to an atmospheric pressure of an external environment of the carrier device or a discharge amount in the exhaust process.

According to another aspect of the present disclosure, there is provided a non-volatile storage medium configured to store a program that operates a computer to perform a control method of a carrier device of a work. The carrier device comprises a body; a rotational part provided to be rotatable relative to the body; an arm supported on the rotational part; an end effector provided in a leading end portion of the arm and configured to hold a work; a gas supply unit configured to supply a gas to an arm-side internal space provided in an arm-side base portion of the end effector and/or in the leading end portion of the arm; a supply amount controller configured to control a supply amount of the gas that is to be supplied to the arm-side internal space; and an exhaust unit configured to discharge the gas in the arm-side internal space and/or in a body-side internal space. The program comprises a process of performing on/off control of a supply of the gas to the arm-side internal space and/or control of the supply amount of the gas to the arm-side internal space, according to an atmospheric pressure of an external environment of the carrier device or a discharge amount by the exhaust unit.

DESCRIPTION OF EMBODIMENTS

First Embodiment

Figure 1:
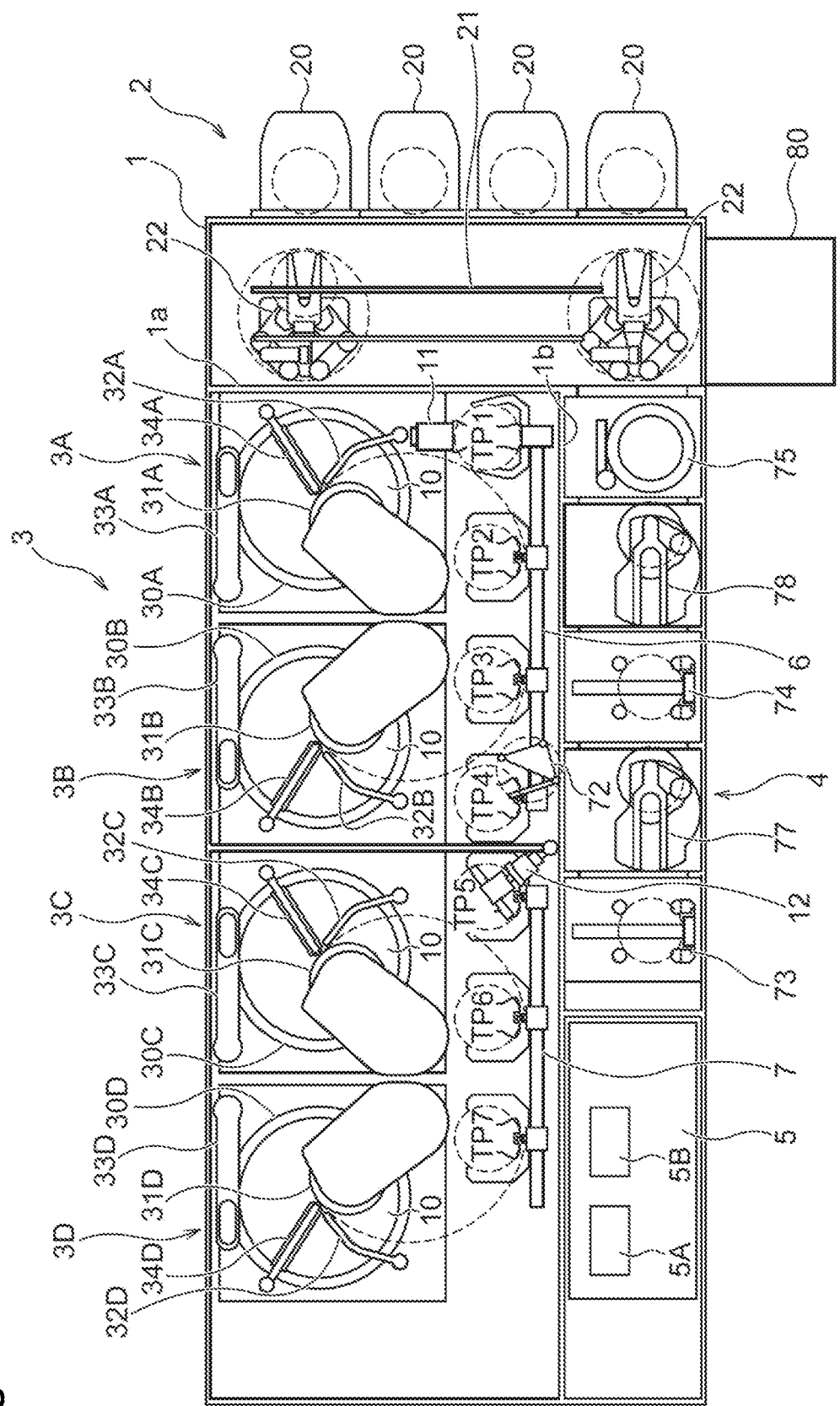
FIG. 1 is a diagram illustrating a polisher device as one example of a work processing apparatus according to a first embodiment.

The following describes embodiments of the present disclosure with reference to drawings. FIG. 1 is a diagram illustrating a polisher device as one example of a work processing apparatus according to a first embodiment. As shown in FIG. 1, this polisher device includes a loading/unloading module 2, a polishing module 3 and a cleaning module 4. The loading/unloading module 2, the polishing module 3 and the cleaning module 4 are parted from each other by partition walls 1a and 1b inside of an approximately rectangular housing 1, as shown in FIG. 1. A controller 5 is provided inside or outside of the housing 1 to control the operations of the respective portions of the polisher device. A polishing object (object to be polished) may be any work, such as a semiconductor wafer, a printed circuit board, a liquid crystal substrate, or an MEMS. In the description below, the polishing object is simply referred to as substrate or wafer.

The loading/unloading module 2 includes front loading units 20 configured such that a wafer cassette for keeping one or a plurality of wafers in stock is mounted on each of the front loading units 20. This loading/unloading portion 2 is provided with a traveling mechanism 21 that is laid along an array of the front loading units 20. Two transfer robots (loaders) 22 are placed on this traveling mechanism 21 to be movable along an array direction of the wafer cassettes. The transfer robot 22 moves on the traveling mechanism 21 to provide access to the wafer cassette mounted on the front loading unit 20. According to this embodiment, an inline film thickness measuring instrument 80 is provided adjacent to the transfer robot 22 (described later). Before and/or after polishing, the wafer (substrate) as the polishing object is conveyed by the transfer robot 22 to the inline film thickness measuring instrument 80 to be subjected to measurement of the film thickness of the wafer.

The polishing module 3 is an area where polishing of wafers is performed and includes a first polishing unit 3A, a second polishing unit 3B, a third polishing unit 3C and a fourth polishing unit 3D. As shown in FIG. 1, the first polishing unit 3A includes a first polishing table 30A provided with a polishing pad 10 having a polishing surface; a first top ring 31A configured to hold a wafer and polish the wafer while pressing the wafer against the polishing pad 10 on the polishing table 30A, a first polishing liquid supply mechanism 32A configured to supply a polishing liquid (for example, slurry) and a dressing liquid (for example, pure water) to the polishing pad 10; a first dresser 33A configured to perform dressing of the polishing surface of the polishing pad 10; and a first atomizer 34A configured to spray a mixed fluid of a liquid (for example, pure water) and a gas (for example, nitrogen gas) or a liquid (for example, pure water) onto the polishing surface.

The second polishing unit 3B similarly includes a second polishing table 30B provided with the polishing pad 10, a second top ring 31B, a second polishing liquid supply mechanism 32B, a second dresser 33B and a second atomizer 34B. The third polishing unit 3C similarly includes a third polishing table 30C provided with the polishing pad 10, a third top ring 31C, a third polishing liquid supply mechanism 32C, a third dresser 33C and a third atomizer 34C. The fourth polishing unit 3D similarly includes a fourth polishing table 30D provided with the polishing pad 10, a fourth top ring 31D, a fourth polishing liquid supply mechanism 32D, a fourth dresser 33D and a fourth atomizer 34D.

A wafer is polished by a following procedure. While the top ring 31A and the polishing table 30A are respectively rotated, the polishing liquid (slurry) is supplied from the polishing liquid supply mechanism 32A onto the polishing pad 10. In this state, the top ring 31A with the wafer held on a lower surface thereof places the wafer on a polishing surface of the polishing pad 10 (to come into contact with the polishing surface) and presses the wafer against the polishing surface. The surface of the wafer is polished by the mechanical action of abrasive grains contained in the polishing liquid and the chemical action of the polishing liquid. After polishing, dressing (conditioning) of the polishing surface is performed by the dresser 33A. A high-pressure fluid is then supplied from the atomizer 34A to the polishing surface to remove the polishing waste and the abrasive grains remaining on the polishing surface.

In FIG. 1, a first linear transporter 6 is placed adjacent to the first polishing unit 3A and the second polishing unit 3B. The first linear transporter 6 is a mechanism configured to convey the wafer between four different transfer positions (a first transfer position TP1, a second transfer position TP2, a third transfer position TP3 and a fourth transfer position TP4). A second linear transporter 7 is placed adjacent to the third polishing unit 3C and the fourth polishing unit 3D. The second linear transporter 7 is a mechanism configured to convey the wafer between three different transfer positions (a fifth transfer position TP5, a sixth transfer position TP6 and a seventh transfer position TP7).

The wafer is conveyed by the first linear transporter 6 to the polishing units 3A and 3B. The top ring 31A of the first polishing unit 3A is moved between a position above the polishing table 30A and the second transfer position TP2 by its swinging action. Accordingly, the wafer is transferred to the top ring 31A at the second transfer position TP2. Similarly, the top ring 31B of the second polishing unit 3B is moved between a position above the polishing table 30B and the third transfer position TP3, and the wafer is transferred to the top ring 31B at the third transfer position TP3. The top ring 31C of the third polishing unit 3C is moved between a position above the polishing table 30C and the sixth transfer position TP6, and the wafer is transferred to the top ring 31C at the sixth transfer position TP6. The top ring 31D of the fourth polishing unit 3D is moved between a position above the polishing table 30D and the seventh transfer position TP7, and the wafer is transferred to the top ring 31D at the seventh transfer position TP7.

A lifter 11 is placed adjacent to the first transfer position TP1 to receive the wafer from the transfer robot 22. The wafer is transferred from the transfer robot 22 to the first linear transporter 6 via the lifter 11. The partition wall 1*a* is provided with a shutter (not shown) that is placed between the lifter 11 and the transfer robot 22. In the process of conveying the wafer, the shutter is opened to enable the wafer to be transferred from the transfer robot 22 to the lifter 11.

A swing transporter 12 is placed between the first linear transporter 6, the second linear transporter 7 and the cleaning module 4. The conveyance of the wafer from the first linear transporter 6 to the second linear transporter 7 is performed by the swing transporter 12. The wafer is conveyed to the third polishing unit 3C and/or the fourth polishing unit 3D by the second linear transporter 7.

A temporary placing table 72 for the wafer that is mounted on a non-illustrated frame is placed on a side of the swing transporter 12. This temporary placing table 72 is placed adjacent to the first linear transporter 6 and is located between the first linear transporter 6 and the cleaning module 4. The swing transporter 12 is moved between the fourth transfer position TP4, the fifth transfer position TP5 and the temporary placing table 72. The wafer placed on the temporary placing table 72 is conveyed to the cleaning module 4 by a first transfer robot 77 of the cleaning module 4. According to the embodiment described above, when the wafer is to be transferred between the respective polishing units 3A to 3D, the wafer is removed from the top ring and is conveyed to another polishing unit via the linear transporters 6 and 7. The wafer transfer mechanism between the polishing units is, however, not limited to the configuration of this embodiment. For example, another wafer transfer mechanism may directly move the top ring holding the wafer to another polishing unit, so as to convey the wafer.

The cleaning module 4 includes a primary cleaner 73 and a secondary cleaner 74 configured to clean the polished wafer with a cleaning liquid and a dryer 75 configured to dry the cleaned wafer. A first transfer robot 77 is placed between the primary cleaner 73 and the secondary cleaner 74. The first transfer robot 77 operates to convey the wafer from the temporary placing table 72 to the primary cleaner 73 and further convey the wafer from the primary cleaner 73 to the secondary cleaner 74. A second transfer robot 78 is placed between the secondary cleaner 74 and the dryer 75. The second transfer robot 78 operates to convey the wafer from the secondary cleaner 74 to the dryer 75.

The dried wafer is taken out of the dryer 75 by the transfer robot 22 to be returned to the wafer cassette. As described above, the wafer is subjected to the series of processing including polishing, cleaning, drying and measurement of the film thickness.

The controller 5 is configured to control the operations of the respective portions of the polisher device described above and thereby control wafer processing operations. The controller 5 includes a memory 5A configured to store various set data and various programs, and a CPU 5B configured to execute the programs stored in the memory. A storage medium that is configured as the memory may include a volatile storage medium and/or a non-volatile storage medium. The storage medium may include one or a plurality of any storage mediums, for example, a ROM, a RAM, a hard disk, a CD-ROM, a DVD-ROM and a flexible disk. The programs stored in the memory include, for example, a program of controlling the conveyance of the respective transfer robots, a program of controlling a supply amount of a gas and/or a discharge amount of the gas into and out of each transfer robot, a program of controlling the polishing operations of the respective polishing units, a program of controlling the respective processes of the cleaners and the dryer included in the cleaning module, and a program of controlling the operation of the film thickness measuring instrument. The controller 5 is configured to make communication with a non-illustrated upper level controller that integrally controls the polisher device and other relevant devices and to transmit data to and from a database provided in the upper level controller. The controller 5 controls respective parts of the transfer robots, such as a supply amount controller (control unit) 724, an ejector 732 and a switching valve 754 (described later). The controller 5 and/or other one or multiple controllers may cooperatively or alone control the respective parts of the transfer robots, such as the supply amount controller 724, the ejector 732 and the switching valve 754.

Figure 2:
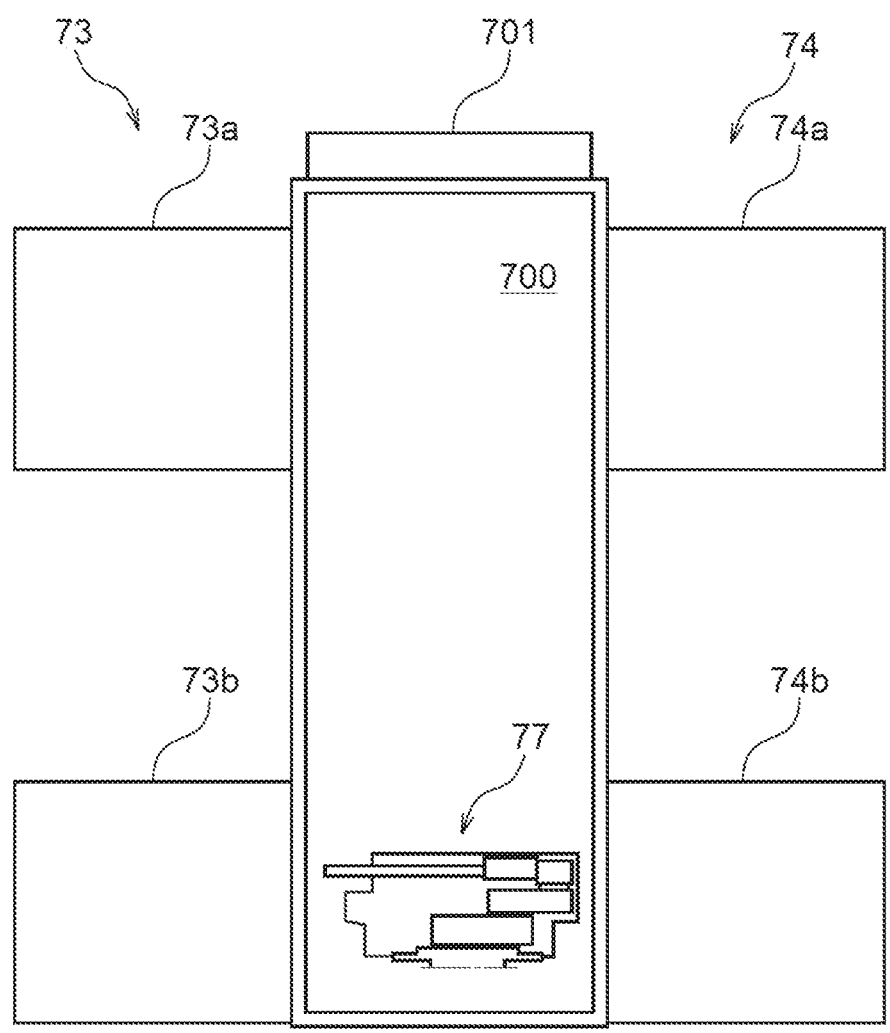
FIG. 2 is a side view schematically illustrating a geometry of a transfer robot in a cleaning module.

FIG. 2 is a side view schematically illustrating a geometry of the transfer robot in the cleaning module. The following describes the first transfer robot 77 placed between the primary cleaner 73 and the secondary cleaner 74 as an example. A similar geometry is employed for the second transfer robot 78 placed between the secondary cleaner 74 and the dryer 75. A robot area 700 is provided between the primary cleaner 73 and the secondary cleaner 74. The first transfer robot 77 is placed in this robot area 700. An air inlet part is provided above the robot area 700. For example, the clean air is introduced from the air inlet part via a fan filter unit 701. The primary cleaner 73 includes an upper cleaning module 73*a* and a lower cleaning module 73*b*, and the secondary cleaner 74 includes an upper cleaning module 74*a* and a lower cleaning module 74*b*. The transfer robot 77 is configured to be moved in a vertical direction by a non-illustrated lift mechanism, to access the upper cleaning modules 73*a* and 74*a* and the lower cleaning modules 73*b* and 74*b* and to carry the work into and out of the respective modules. In the geometry of the second transfer robot 78, the primary cleaner 73, the first transfer robot 77 and the secondary cleaner 74 shown in FIG. 2 are respectively replaced by the secondary cleaner 74, the second transfer robot 78 and the dryer 75. Like the primary and the secondary cleaners, the dryer 75 also includes an upper drying module and a lower drying module. This illustrated example describes the two-stage configuration as the configuration of the respective modules (the cleaners and the dryer). The configuration of the respective modules is, however, not limited to the illustrated configuration. The number of stages of each module may be one stage or may be three or more stages. The number of stages of one module may be different from the number of stages of another module.

Figure 3:
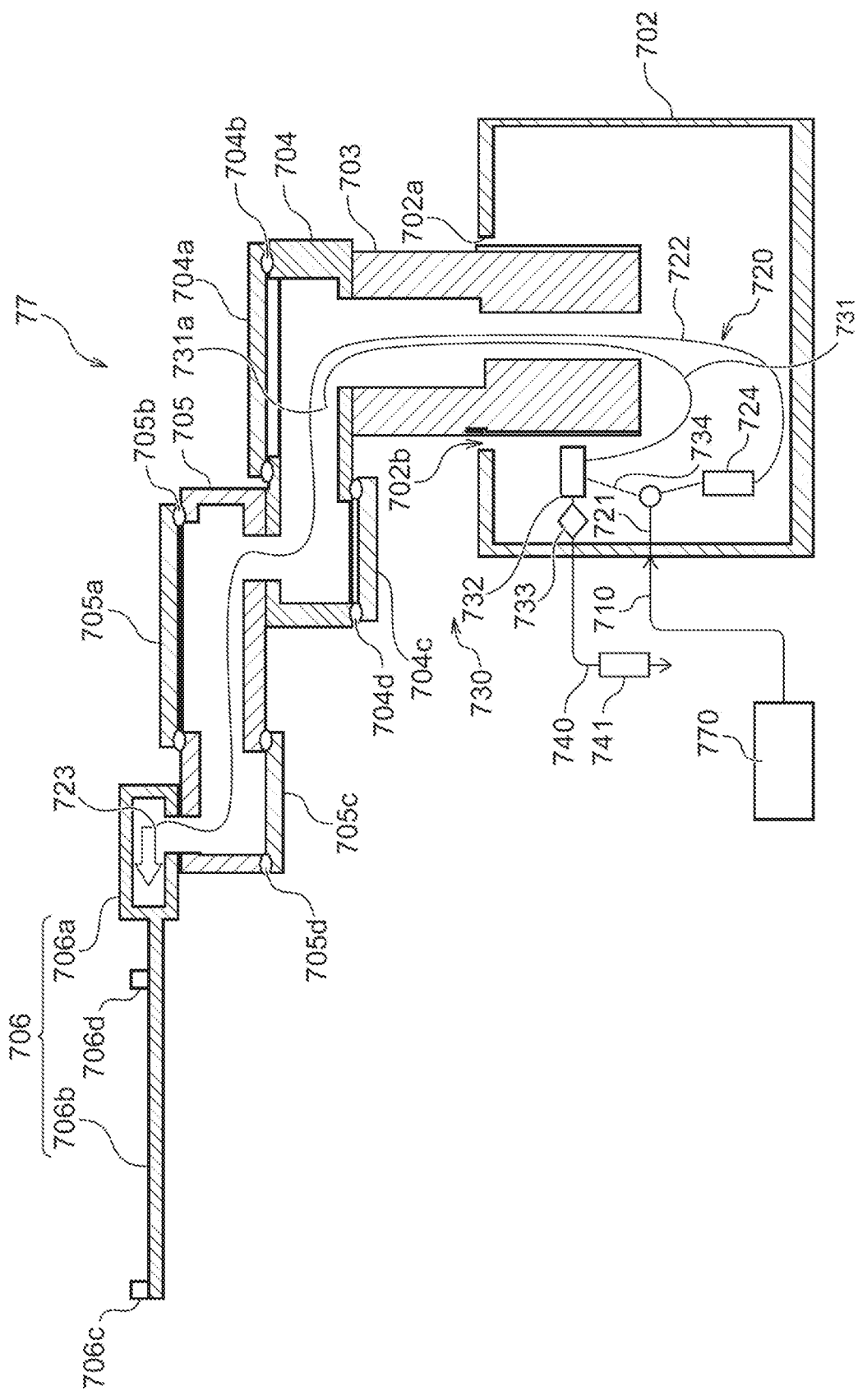
FIG. 3 is a sectional view schematically illustrating the configuration of a transfer robot according to a first embodiment.

FIG. 3 is a sectional view schematically illustrating the configuration of the transfer robot according to the first embodiment. The following describes the configuration of the first transfer robot 77 as an example. A similar configuration is employed for the second transfer robot 78. The first transfer robot 77 includes a body (base) 702, a rotational part 703, a first arm 704, a second arm 705 and an end effector 706. The first transfer robot 77 has a space of the high sealing performance to suppress or prevent invasion of the moisture and the high humidity air from the external environment. This space includes an arm-side internal space that is defined by the first arm 704, the second arm 705 and/or the end effector 706, and a body-side internal space that communicates with the arm-side internal space and that is defined by the rotational part 703 and the body 702.

The body 702 is configured to be moved in the vertical direction and rotate in a horizontal direction by a non-illustrated lifting device and rotating device. The body 702 is configured by a hollow member having a space inside thereof and has an opening 702a to receive the rotational part 703 therein.

The opening 702a has a slight gap 702b formed between the rotational part 703 and the body 702. An exhaust line 731 that is in fluid communication with an exhaust unit 730 (described later) is placed in an internal space of the first arm 704. An exhaust port 731a is provided at a leading end of the exhaust line 731 and is configured such that the air in the arm-side internal space defined by the first arm 704, the second arm 705 and the end effector 706 is sucked from this exhaust port 731a. The exhaust line 731 is placed and/or fastened in the first arm 704 by any fixing device.

A supply line 722 that is in fluid communication with a gas supply unit 720 (described later) and a supply port 723 as its opening are provided in an internal space of an end effector base end portion 706a. A gas such as the dry air is supplied from this supply port 723 into the internal space of the end effector base end portion 706a. The supplied gas sequentially flows into the arm-side internal space and the body-side internal space, so that the entire internal space of the transfer robot 77 is filled with the gas such as the dry air.

A motor (not shown) configured to rotate the second arm 705, a pulley configured to transmit the power from the motor and the like are placed in the arm-side internal space. These components may be a source of particles. According to this embodiment, the gas is supplied into the end effector base end portion 706a. The atmospheric pressure in the internal space of the transfer robot 77 is thus likely to gradually increase and become higher than the outside atmospheric pressure. With a view to reducing such an increase in the atmospheric pressure, the exhaust port 731a is provided in the arm-side internal space, which may be the source of particles, to discharge the gas in the arm-side internal space and thereby maintain the arm-side internal space at a negative pressure relative to the external environment. This configuration accordingly prevents leakage of the particles to the outside (dust emission from the first transfer robot 77).

Figure 4:
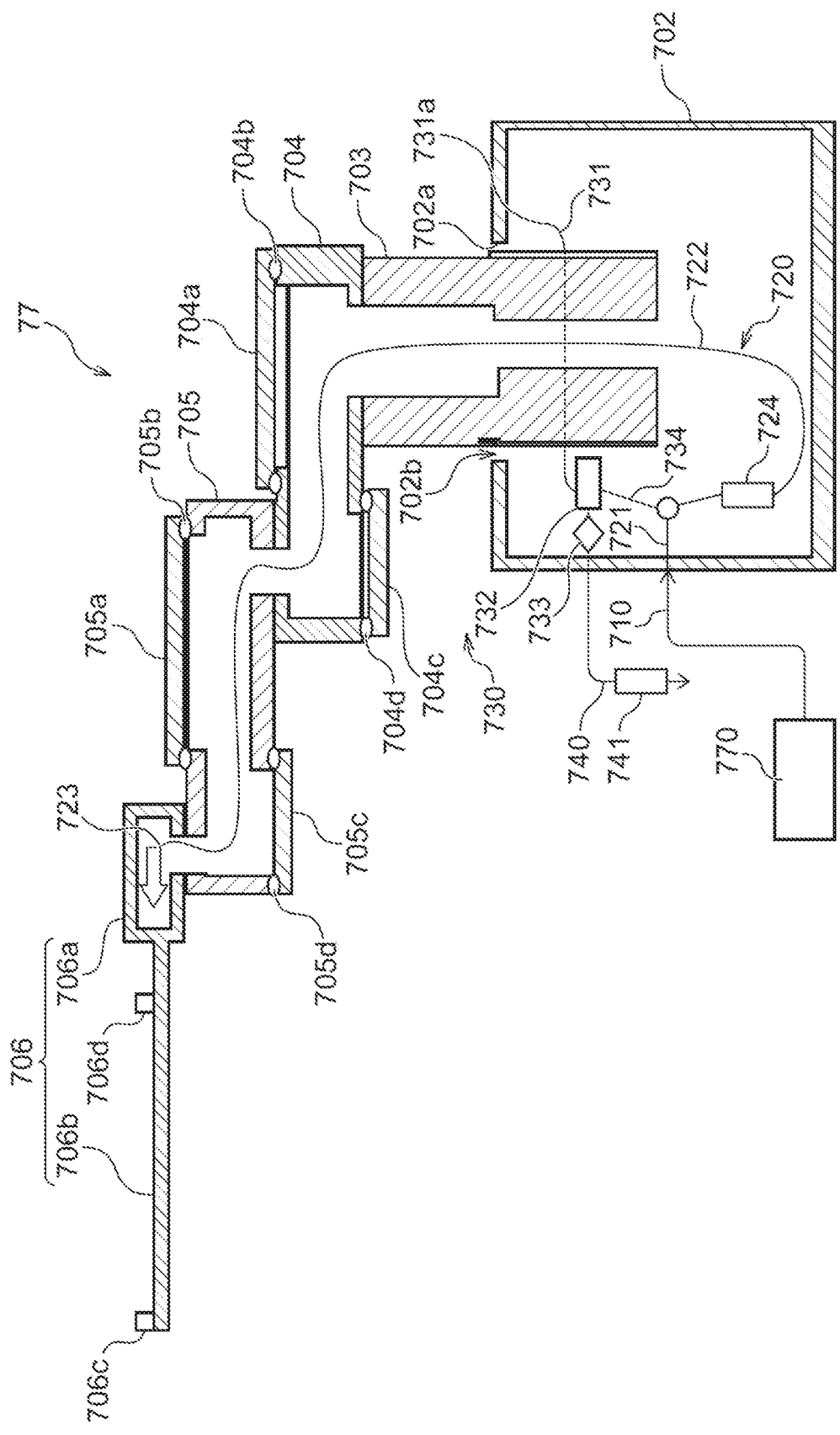
FIG. 4 is a sectional view schematically illustrating the configuration of a transfer robot according to a second embodiment.

FIG. 4 is a sectional view schematically illustrating the configuration of a transfer robot according to a second embodiment. The difference of the configuration of this embodiment from the configuration of the first embodiment is that the exhaust port 731a is placed in the body-side internal space and is configured such that the air in the body-side internal space is sucked from the exhaust port 731a.

A motor (not shown) configured to rotate the rotational part 703, a pulley configured to transmit the power from the motor, and the like are placed in the body-side internal space. These components may be a source of particles. The configuration of this embodiment evacuates the body-side internal space, which may be the source of particles and thereby maintain the body-side internal space at a negative pressure relative to the external environment. This configuration accordingly prevents leakage of the particles to the outside (dust emission from the first transfer robot 77).

In the configuration of FIG. 3 or the configuration of FIG. 4, the rotational part 703 is inserted into the opening 702a of the body 702 and is supported to be rotatable relative to the body 702. The rotational part 703 is configured to be rotated by the power from a non-illustrated motor. The rotational part 703 is a hollow member having an internal space. The internal space of the rotational part 703 is in fluid communication with an internal space of the body 702 and forms the body-side internal space.

The first arm 704 is fixed to the rotational part 703 to rotate along with the rotational part 703. The first arm 704 is a hollow member having an internal space. The internal space of the first arm 704 is in fluid communication with the internal space of the rotational part 703. The first arm 704 has openings formed in an upper surface and a lower surface for the purpose of maintenance and the like. The respective openings are closed by covers 704a and 704c. 0 rings 704b and 704d are placed between the respective covers 704a and 704c and the respective openings to seal the internal space of the first arm 704. This configuration suppresses or prevents invasion of the moisture and the high humidity air from the external environment through clearances between the openings and the covers of the first arm 704.

The second arm 705 is mounted to the first arm 704 to be pivotable relative to the first arm 704. The second arm 705 is a hollow member having an internal space. The internal space of the second arm 705 is in fluid communication with the internal space of the first arm 704. The second arm 705 has openings formed in an upper surface and a lower surface for the purpose of maintenance and the like. The respective openings are closed by covers 705a and 705c. 0 rings 705b and 705d are placed between the respective covers 705a and 705c and the respective openings to seal the internal space of the second arm 705. This configuration suppresses or prevents invasion of the moisture and the high humidity air from the external environment through clearances between the openings and the covers of the second arm 705.

The end effector 706 is mounted to the second arm 705 to be pivotable relative to the second arm 705. The end effector 706 includes the end effector base end portion 706a and an end effector holding portion 706b. The end effector base end portion 706a is a hollow member having an internal space. The internal space of the end effector base end portion 706a is in fluid communication with the internal space of the second arm 705. The end effector holding portion 706b is a member configured to hold the work and has two claws 706c and two claws 706d respectively on its leading end side and on its base end side. Only one claw 706c and one claw 706d are illustrated in FIG. 3 and in FIG. 4, but the other claws are present behind the sheet surface. The work is placed between these claws 706c and 706d, such that the outer circumference of the work is supported and held by the claws 706c and 706d. The number and the locations of the claws 706c and 706d are only illustrative, but any number of and any locations of claws may be provided. This end effector 706 is a so-called drop-down (concave)-type end effector to drop down a work between a plurality of claws and hold the work between the plurality of claws. The end effector base end portion 706a may be provided with non-illustrated openings that may be closed by covers via 0 rings. The end effector may be configured as a hand to clamp and hold the work.

The first transfer robot 77 except the gap 702b is sealed, so that the inside of the first transfer robot 77 is substantially sealed to suppress or prevent invasion of the moisture and the high humidity air. The gap 702b is a place that is likely to cause a leakage of particles depending on a relationship between the interior pressure and the exterior pressure of the first transfer robot 77 or the like as described above, but is still sealed to such a level that suppresses or prevents invasion of the moisture and the high humidity air from the external environment. The foregoing illustrates the configuration of sealing the openings of the end effector and the arms by means of the 0 rings. Another sealing structure may, however, be employed.

The first arm 704, the second arm 705 and the end effector 706 may be linked with each other and may be configured such that the rotation of the first arm 704 by the rotational part 703 causes the second arm 706 and the end effector 706 to rotate and move forward or move back in conjunction with each other. The driving mechanism of the first transfer robot 77 described above is only illustrative, and any driving mechanism may be employed. The first transfer robot 77 may be configured as a carrier device of a multi joint robot structure that has an end effector and one arm (arm unit) linked with each other and that has internal spaces of the end effector and the one arm unit in fluid communication with each other. The first transfer robot 77 may be provided with three or more arms.

(Gas Supply Unit)

The first transfer robot 77 according to the first embodiment and according to the second embodiment has a gas supply unit 720. The first transfer robot 77 is configured to convey the substrate after the polishing process to the cleaning module and may convey the substrate in the wet state for the purpose of suppressing fixation of slurry. The conveyance in the wet environment causes the external environment of the first transfer robot 77 to have high humidity and is more likely to cause the inside of the first transfer robot 77 to become the state of high humidity, due to the reasons described in Summary. There is accordingly a possibility of dew condensation in the transfer robot. The gas supply unit 720 is provided to purge the internal space of the first transfer robot 77 with the dry air or the like and thereby suppress or prevent such dew condensation.

The gas supply unit 720 serves to supply the gas to the internal spaces of the end effector 706, the second arm 705, the first arm 704, the rotational part 703 and/or the body 702. The gas supply unit 720 directly introduces the gas from a gas supply source 770 provided outside of the first transfer robot 77 into the internal space of the first transfer robot 77. The gas supply unit 720 includes supply lines 721 and 722, a supply port 723 and a supply amount controller 724. The supply amount controller 724 may be configured to include at least one of structures controlling the flow rate, for example, a flow control valve, an on-off valve or an orifice. The supply line 721 is connected with a supply line 710 provided outside of the robot. The supply line 710 is connected with the gas supply source 770 of the dry air (CDA), nitrogen and the like. The gas supply source 770 is a gas supply source provided outside of the first transfer robot 77. The gas supply source 770 may be, for example, an existing utility line of a work processing apparatus. The utility line denotes a piping used to supply electric power, water, a fluid and/or a fuel required for operations of the work processing apparatus. This configuration uses the gas from the existing utility line of the work processing apparatus and does not need to separately provide a gas supply source. This configuration can thus suppress complication of piping and/or reduce a cost increase. Part or all of the supply lines 710, 721 and 722 may be configured by flexible pipes. Each of the supply lines 710, 721 and 722 may be configured by a single pipe or a plurality of pipes. The supply amount controller 724 is provided in the middle of the supply line 722 to regulate the supply amount of the gas. The supply line 722 is extended from the internal space of the body 702 through the internal spaces of the rotational part 703, the first arm 704 and the second arm 705 to the internal space of the end effector base end portion 706a. The supply line 722 is provided with the supply port 723 that is open to the internal space of the end effector base end portion 706a. The gas supplied from the supply line 710 flows through the supply lines 721 and 722 and is supplied from the supply port 723 into the internal space of the end effector base end portion 706a. The gas supplied to the internal space of the end effector base end portion 706a flows through the arm-side internal space of the second arm 705, the first arm 704 and the rotational part 703 to fill the body-side internal space of the body 702. As a result, the entire internal space of the transfer robot 77 is purged. The supply port 723 is not necessarily located in the internal space of the end effector 706 but may be located at another position in the arm-side internal space and in either of the internal spaces of the rotational part 703 and the body 702. A plurality of the supply ports 723 may be provided. The respective components of the gas supply unit 720 may be appropriately placed and/or fastened in the transfer robot 77 by any fixing device.

The following describes a reason why the supply amount controller 724 is provided. The cleanliness of such a level that is specified by ISO class 1 to 2 is generally required for a transfer robot used in a semiconductor manufacturing device as one example of the work processing apparatus. In order to satisfy this criterion, it is required to set the supply amount of the purging gas (dry air or nitrogen) in a desired range. The excessive supply amount may cause the atmospheric pressure in the internal space of the transfer robot 77 to be higher than the outside atmospheric pressure and may cause a leakage of particles. According to this embodiment, the supply amount controller 724 is employed as the supply amount regulating mechanism to regulate the supply amount of the gas to such a level that suppresses or prevents diffusion of particles generated in the internal space of the first transfer robot 77 and/or suppresses or prevents leakage of particles from the internal space of the first transfer robot 77 to the outside. In other words, the supply amount controller 724 serves to regulate the supply amount of the gas to be less than such a supply amount that causes leakage of particles from the inside of the first transfer robot 77 to the outside. This configuration suppresses or prevents dew condensation in the internal space of the first transfer robot 77, while suppressing leakage of particles and maintaining a desired cleanliness.

The type, the temperature and the supply amount of the gas to be supplied by the gas supply unit 720 are selected such as to suppress or prevent dew condensation in the internal space of the transfer robot 77 and suppress or prevent generation of particles (dust emission) from the first transfer robot 77. The supply amount of the gas can be regulated by the supply amount controller 724 to such a level that suppresses or prevents dew condensation in the internal space of the first transfer robot 77 and that suppresses or prevents generation of particles from the first transfer robot 77. The supply amount controller 724 may be provided with a control valve to make the supply amount of the gas variable and may be provided with an orifice in place of the control valve not to make the supply amount of the gas variable. In the latter case, an orifice configured to provide a desired supply amount of the gas (such a supply amount that suppresses or prevents dew condensation in the internal space of the transfer robot and that suppresses or prevents generation of particles from the transfer robot) may be selected or formed and placed by taking into account the supply amount of the gas that is supplied from the outside. Both a control valve and an orifice may be provided. This configuration may improve the flexibility in the regulation range and the regulation accuracy of the supply amount of the gas.

On/off control of the supply of the gas into the first transfer robot 77 may be performed according to the atmospheric pressure of the external environment, or the supply amount of the gas into the first transfer robot 77 may be changed, according to the atmospheric pressure of the external environment, so as to suppress dew condensation, while suppressing or preventing dust emission (leakage of particles) from the first transfer robot 77 and maintaining the cleanliness. In a semiconductor manufacturing device, there is generally a pressure difference between a robot area where a transfer robot is placed and the inside of a module that processes the wafer. The robot area has the high atmospheric pressure (positive pressure), and the inside of the module has the lower atmospheric pressure (negative pressure) than that of the robot area. In the case where the inside of the transfer robot fails to maintain a negative pressure relative to the atmospheric pressure of the external environment, it is more likely to cause dust emission from the inside of the transfer robot. Turning off the supply of the gas or reducing the supply amount of the gas at the timing when the transfer robot accesses the module enables the inside of the transfer robot to be maintained at a negative pressure relative to the atmospheric pressure of the external environment and thereby reduces the possibility of dust emission from the transfer robot.

For example, employing an on-off valve for the supply amount controller 724 to turn on/off the supply of the gas can suppress or prevent dust emission from the first transfer robot 77. The on-off valve is, for example, an electromagnetic valve and is placed on the flow path of the supply line 721 or 722. In this configuration, closing (turning off) the on-off valve at the timing when the atmospheric pressure in the internal space of the first transfer robot 77 becomes higher than the atmospheric pressure of the external environment, for example, at the timing when the first transfer robot 77 accesses the module, enables the inside of the first transfer robot 77 to be maintained at a negative pressure and suppresses or prevents dust emission from the first transfer robot 77. Changing the opening position (opening degree) of the on-off valve (electromagnetic valve) of the supply amount controller 724 to reduce the supply amount of the gas at the timing when the atmospheric pressure in the internal space of the first transfer robot 77 becomes higher than the atmospheric pressure of the external environment, for example, at the timing when the first transfer robot 77 accesses the module, enables the inside of the first transfer robot 77 to be maintained at a negative pressure and suppresses or prevents dust emission from the first transfer robot 77.

Figure 7:
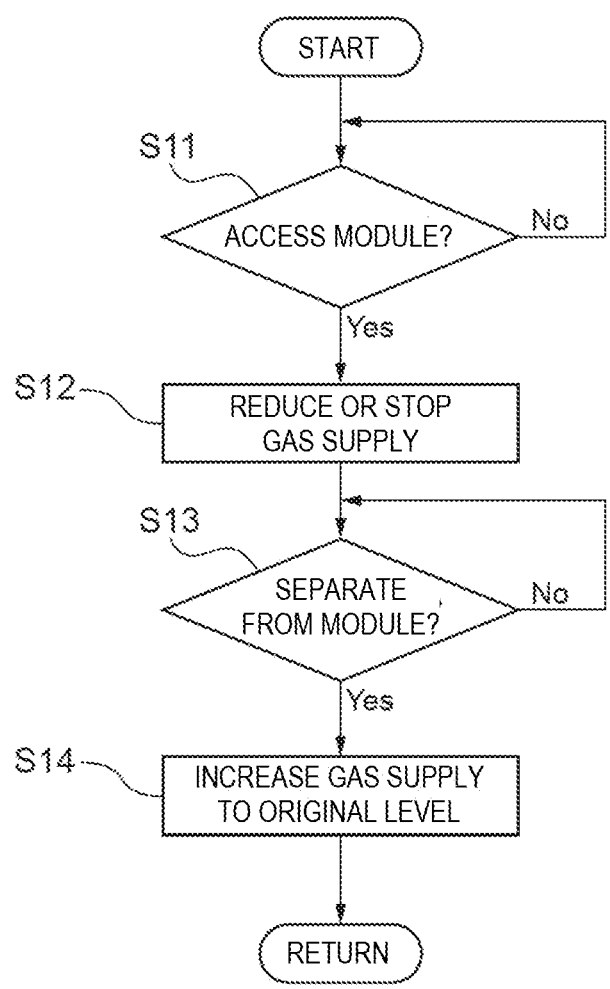
FIG. 7 is a flowchart showing a process of controlling the supply amount of a gas according to the atmospheric pressure of an external environment.

FIG. 7 is a flowchart showing a process of controlling the supply amount of the gas according to the atmospheric pressure of the external environment. This process is performed by, for example, the controller 5 during supply of the gas by the gas supply unit 720. The supply of the gas by the gas supply unit 720 is also performed by, for example, the controller 5.

At step S11, it is determined whether the present time is a timing when the first transfer robot 77 accesses a module (a cleaning module or a drying module). For example, the controller 5 may detect whether the present time reaches a timing when the controller 5 gives an instruction to the first transfer robot 77 to access the module (including carry-in or carry-out of a substrate), so as to determine whether the present time is the timing to access the module. A conveyance program (stored in the controller 5 as an example) may be executed to give an instruction to the first transfer robot 77 to access the module and to detect the timing for giving the instruction.

When it is determined at step S11 that the present time is the timing to access the module, the control flow proceeds to step S12. At step S12, the supply amount controller 724 is made to reduce the supply amount of the gas or to stop the supply of the gas, such that the inside of the first transfer robot 77 is maintained at a negative pressure relative to the atmospheric pressure in the module at the time to access the module. The control flow subsequently proceeds to step S13. When it is determined at step S11 that the present time is not the timing to access the module, on the other hand, the control flow repeats the processing of step S11.

At step S13, it is determined whether the first transfer robot 77 is separated from the module. The processing of step S13 is repeated until it is determined that the first transfer robot 77 is separated from the module. For example, the controller 5 may detect whether the end effector 706 of the first transfer robot 77 is separated from the module and a gate valve (not shown) of the module is closed, so as to determine whether the first transfer robot 77 is separated from the module. When it is determined at step S13 that the first transfer robot 77 is separated from the module, the control flow proceeds to step S14. At step S14, the supply amount controller 724 is made to increase the supply amount of the gas to an original supply amount or to open (turn on) the on-off valve and resume the supply of the gas.

(Exhaust Unit)

The first transfer robot 77 according to the first embodiment and the second embodiment has an exhaust unit 730. When a high humidity atmosphere of the external environment enters the first transfer robot 77, the exhaust unit 730 serves to discharge the high humidity atmosphere and thereby suppress or prevent the high humidity atmosphere from being circulated in the first transfer robot 77. The atmospheric pressure in the first transfer robot 77 is raised by the gas supplied from the gas supply unit 720. The exhaust unit 730 also serves to evacuate the inside of the first transfer robot 77 and thereby prevent an increase of the atmospheric pressure in the first transfer robot 77 and enable the inside of the first transfer robot 77 to be maintained at a negative pressure relative to the external environment. Maintaining the inside of the first transfer robot 77 at a negative pressure serves to suppress or prevent leakage of particles from inside to outside of the first transfer robot 77. The exhaust unit 730 includes an exhaust line 731, and an ejector 732 and a filter 733 that are provided in the exhaust line 731. An exhaust port 731a is provided at a leading end on one side of the exhaust line 731 and is open to the body-side internal space of the body 702. The exhaust port 731a may be placed in the body-side internal space of the rotational part 703 or may be placed in the arm-side internal space defined by the first arm 704, the second arm 705 and/or the end effector 706. A plurality of exhaust ports 731a may be provided at positions where the high humidity atmosphere of the external environment is likely to enter, for example, the vicinity of the opening 702a of the body 702 and the vicinity of the openings of the respective arms. In the case where the internal spaces of the respective components of the first transfer robot 77 communicate with each other, the exhaust port 731a serves to evacuate all the internal spaces communicating with each other (the entire internal space of the first transfer robot 77), irrespective of which component the exhaust port 731a is located in. The other side of the exhaust line 731 connected with an outside exhaust line 740 via the ejector 732 and the filter 733. A silencer 741 is connected with the exhaust line 740 to reduce the exhaust noise. A driving fluid supply line 734 is connected with the ejector 732, such that the gas is supplied from the driving fluid supply line 734 that is branched off from the supply line 721 of the gas supply unit 720. The ejector 732 is configured to evacuate the body-side internal space of the body 702 by using the gas supplied as the driving fluid from the driving fluid supply line 734. The exhaust sucked by the ejector 732 is filtrated by the filter 733, is muffled by the silencer 741 and is then discharged. Part or all of the respective exhaust lines 731 and 740 and the driving fluid supply line 734 may be configured by flexible pipes. Each of the respective exhaust lines 731 and 740 and the driving fluid supply line 734 may be configured by a single pipe or a plurality of pipes. The discharge amount by the exhaust unit 730 is controllable by regulating the supply amount of the driving fluid (gas) from the driving fluid supply line 734. The supply amount may be controlled by, for example, a flow control valve, an on-off valve or an orifice (not shown). The discharge amount may be controlled by using, for example, a non-illustrated temperature sensor, humidity sensor and/or atmospheric pressure sensor and may be varied, based on detection values of the temperature, the humidity and/or the atmospheric pressure in the internal space of the first transfer robot 77 and in the external environment of the first transfer robot 77. The supply amount of the gas by the gas supply unit 720 may be varied with a variation in the atmospheric pressure in the external environment of the transfer robot 77 and/or with a variation in the discharge amount. The respective components of the exhaust unit 730 may be appropriately placed and/or fastened in the transfer robot 77 by any fixing device.

According to a modification, a non-illustrated temperature sensor, humidity sensor and/or atmospheric pressure sensor may be provided in the internal space of the first transfer robot 77, and the supply amount of the gas by the gas supply unit and/or the discharge amount of the gas by the exhaust unit may be controlled, based on detection values of the temperature, the humidity and/or the atmospheric pressure. According to another modification, the supply amount of the gas by the gas supply unit and/or the discharge amount of the gas by the exhaust unit may be controlled, based on a comparison between detection values of a non-illustrated temperature sensor, humidity sensor and/or atmospheric pressure sensor provided in an external space of the first transfer robot 77 and detection values of corresponding sensors provided in the internal space of the first transfer robot 77.

Third Embodiment

Figure 5:
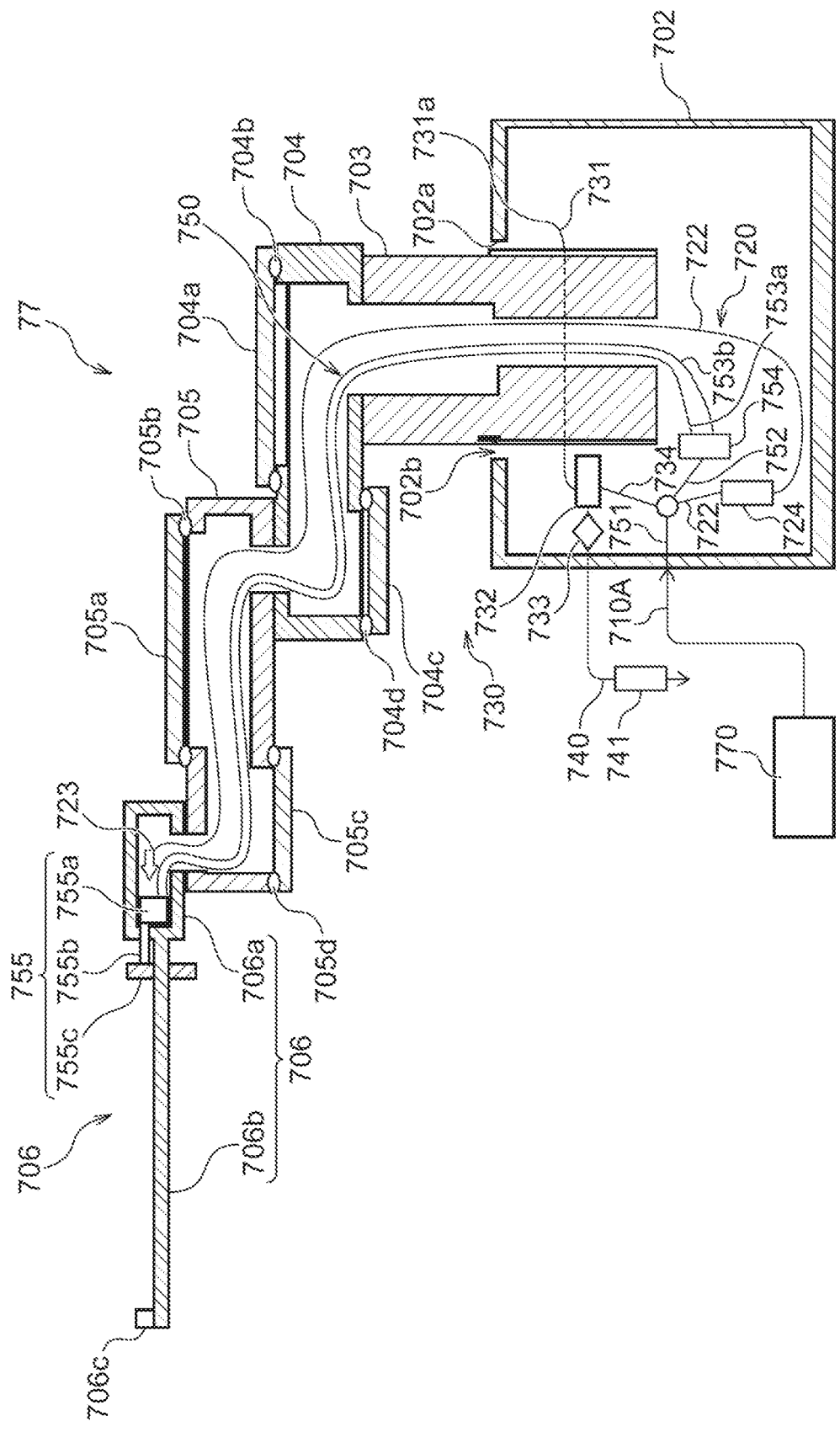
FIG. 5 is a sectional view schematically illustrating the configuration of a transfer robot according to a third embodiment.

FIG. 5 is a sectional view schematically illustrating the configuration of a transfer robot according to a third embodiment. The difference of this embodiment from the embodiments described above is that a gas supply unit 720 receives the supply of the gas from a gas supply line to an existing chuck mechanism. Otherwise the configuration of this embodiment is similar to those of the above embodiments. The following describes only the differences with omitting description of the other configuration.

According to this embodiment, an end effector 706 is provided with a chuck mechanism 755, in place of the claws 706d of the first embodiment. This end effector is a so-called edge grip (chuck)-type end effector. The chuck mechanism 755 is driven by a gas that is supplied from a driving fluid supply unit 750. The chuck mechanism 755 includes a pressing member 755c, a shaft 755b connected with the pressing member 755c, and a cylinder 755a coupled with the shaft 755b. The cylinder 755a has a piston (not shown) configured to reciprocate in an internal space of the cylinder 755a, and the piston parts the internal space into two chambers. The shaft 755b is connected with the piston such as to move forward or move back by the reciprocation of the piston. An advance-side drive line 753a is connected with one chamber of the cylinder 755a, and a retreat-side drive line 753b is connected with the other chamber. The advance-side drive line 753a and the retreat-side drive line 753b are connected with a drive line 752 via a switching valve 754. The switching valve 754 is, for example, a solenoid valve. The drive line 752 is connected with an external supply line 710A via a drive line 751. The supply line 710A is connected with a gas supply source 770 of a dry air (CDA), nitrogen and the like. The gas supply source 770 is a gas supply source provided outside of the first transfer robot 77. The gas supply source 770 may be, for example, an existing utility line of a work processing apparatus. Part or all of the respective drive lines 751, 752, 753a and 753b may be configured by flexible pipes. Each of the respective drive lines 751, 752, 753a and 753b may be configured by a single pipe or a plurality of pipes. The supply of the gas from the drive line 752 is changed over to either one of the advance-side drive line 753a and the retreat-side drive line 753b by the switching valve 754, so that the piston of the cylinder 755 is moved forward or moved back to advance or retreat the pressing member 755c connected with the shaft 755b.

A substrate is held and released by the chuck mechanism 755 as described below. When the substrate is placed on claws 706c of the end effector 706 and the pressing member 755c and the pressing member 755c is moved forward by the cylinder 755c, the substrate is pressed by the pressing member 755c against the claws 706c to be held between the claws 706c and the pressing member 755c. When the pressing member 755c is moved back by the cylinder 755c, the holding of the substrate by the pressing member 755c is released.

According to this embodiment, the gas supply unit 720 is configured to receive a supply of a gas from a driving fluid supply unit 750 (the drive line 751) that supplies the gas as the driving fluid to the chuck mechanism 755. More specifically, a supply line 722 of the gas supply unit 720 is configured to be branched off from the drive line 751 that supplies the gas as the driving fluid to the chuck mechanism 755. In this configuration, the gas supply unit 720 receives a supply of the gas from the drive line 751 that supplies the driving fluid (the gas) to the chuck mechanism 755, and supplies the gas into the internal space of the first transfer robot 77 via a supply port 723. According to this embodiment, the gas supply unit 720 receives a supply of the gas from the existing supply line for the chuck mechanism 755. There is accordingly no need to separately provide a gas supply source or an external supply line for the gas supply unit 720 for suppressing dew condensation. There is also no need to modify the housing of the transfer robot for connection of the external supply line for the gas supply unit.

Figure 6:
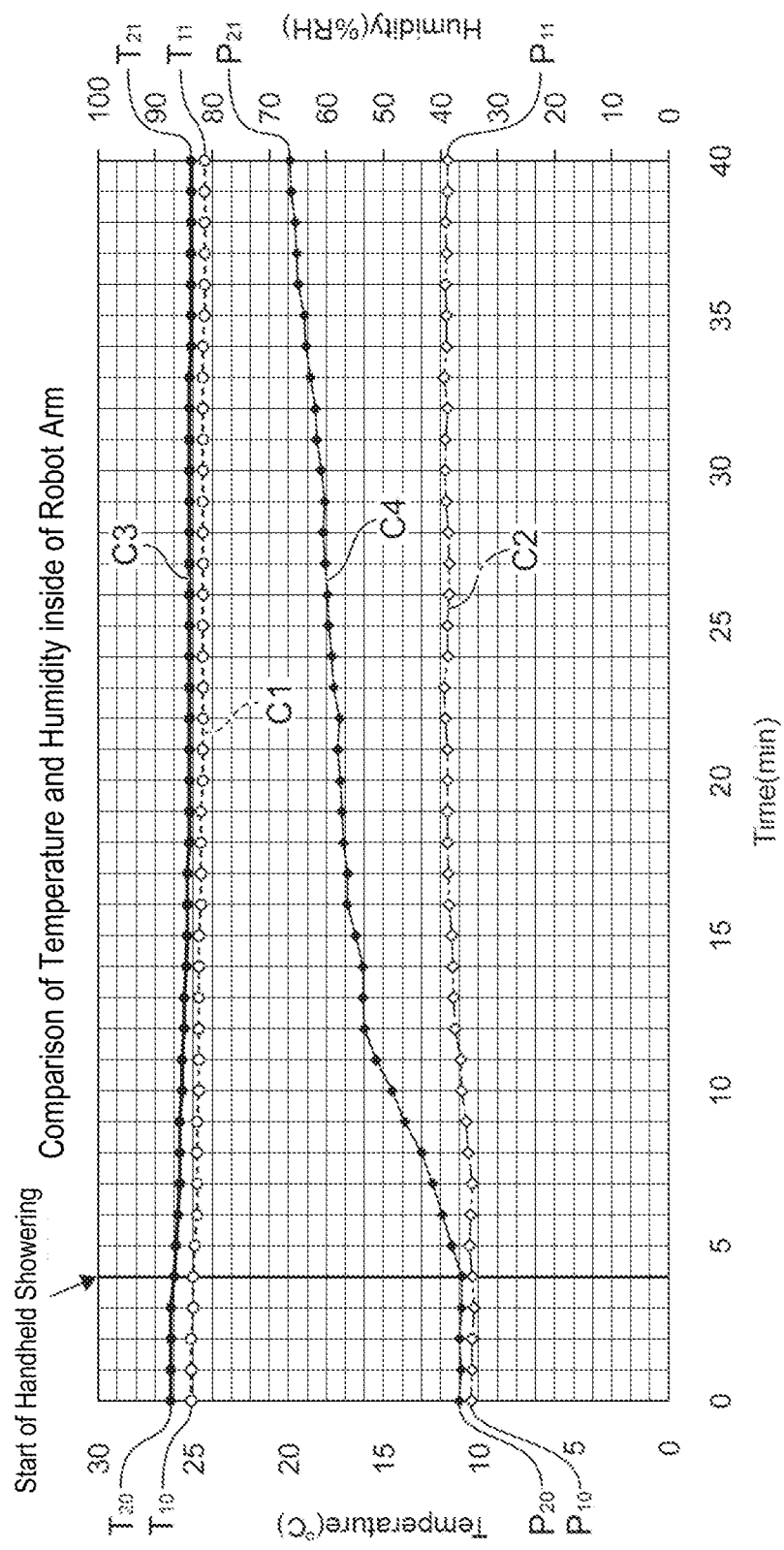
FIG. 6 is a graph showing an example of an experiment that measures variations in humidity in transfer robots.

FIG. 6 is a graph showing an example of an experiment that measures variations in humidity inside of transfer robots. The graph shows the time as the abscissa, the temperature as the left ordinate, and the humidity as the right ordinate. Curves C1 and C2 show measurement results of the temperature and the humidity when a gas was supplied to an internal space of a transfer robot by a gas supply unit in the transfer robot according to an embodiment. Curves C3 and C4 show measurement results of the temperature and the humidity according to a comparative example without the gas supply unit provided to supply the gas to the internal space of the transfer robot. In this experiment, about four minutes after a start of measurement, the external environment of the transfer robot was made to have high humidity by handheld showering the entire transfer robot with water for one minute at a flow rate of 1 liter/minute, and variations in the temperature and the humidity in the internal space of the transfer robot were measured. As clearly understood from the measurement results of FIG. 6, the humidity in the internal space of the transfer robot was significantly increased after a start of handheld showering in the comparative example without supplying the gas to the internal space of the transfer robot. An increase in the humidity after a start of handheld showering was, on the other hand, drastically suppressed or reduced in the transfer robot according to the embodiment. This indicates that the configuration of the embodiment reduces the humidity in the internal space of the transfer robot and maintains the condition that is unlikely to cause dew condensation, even when the external environment of the transfer robot has high humidity. The experiment also repeatedly rotated or turned the transfer robot according to the embodiment and measured the atmosphere in a robot area by means of a particle counter. As a result of this measurement, it was confirmed that the transfer robot according to the embodiment had an equivalent level of cleanliness to that of an existing transfer robot without supply of the gas to the inside of the transfer robot.

The configuration of the transfer robot described in each of the above embodiments is only one example of the carrier device. The carrier device may employ any other configuration that has an internal space in an end effector, an arm, a rotational part and/or a body.

The above embodiments illustrate the examples of the transfer robot configured to convey a substrate from the polishing module to the cleaning module of the polisher device. Any of the configurations of the above embodiments is applicable to any carrier device that has a space inside of at least part of members. Accordingly, the configuration of the above embodiment is applicable to a carrier device for any work processing apparatus (for example, a bevel polishing device, a plating device, or a work cleaning device) or any other device and is applicable to a carrier device placed in any portion inside of the work processing apparatus or any other device. Especially, the configuration of the embodiment is preferably applicable to a carrier device for conveyance in a wet environment.

At least the following technical features are provided from the embodiments described above.

According to a first aspect, there is provided a carrier device comprising a body; a rotational part provided to be rotatable relative to the body; an arm supported on the rotational part; an end effector provided in a leading end portion of the arm and configured to hold a work; a gas supply unit configured to supply a gas to an arm-side internal space provided in an arm-side base portion of the end effector and/or in the leading end portion of the arm; and an exhaust unit provided in a body-side internal space that communicates with the arm-side internal space and configured to discharge the gas in the arm-side internal space.

According to the configuration of this aspect, the gas is supplied to the arm-side internal space, so that the supplied gas flows through and fills the arm-side internal space and the body-side internal space communicating with the arm-side internal space. As a result, this configuration enables an entire internal space of a transfer robot to be purged. The configuration of supplying the gas to the arm-side internal space controls the humidity in the arm-side internal space and suppresses dew condensation. Even when the high humidity atmosphere of an external environment enters the arm-side internal space, the configuration of providing the exhaust unit to discharge the gas in the arm-side internal space enables the high humidity atmosphere to be discharged and thereby suppresses or prevents the high humidity atmosphere from being circulated inside of the transfer robot. Furthermore, the configuration prevents an increase of the atmospheric pressure in the arm-side internal space and maintains the arm-side internal space at a negative pressure, thereby suppressing dew condensation while suppressing leakage of particles from the arm-side internal space. The arm-side internal space is in fluid communication with the body-side internal space, so that the gas is suppliable to the body side internal space through the arm-side internal space. This configuration suppresses dew condensation not only in the arm-side internal space but also in the entire transfer robot including the body-side internal space. This configuration also enables the gas in the body-side internal space to be discharged through the arm-side internal space. This enables the entire carrier device to be maintained at a negative pressure and suppresses leakage of particles from the internal space of the carrier device.

The exhaust unit may be provided to discharge the gas in the body-side internal space. Even when the high humidity atmosphere of the external environment enters the body-side internal space, this configuration enables the high humidity atmosphere to be discharged and thereby suppresses or prevents the high humidity atmosphere from being circulated inside of the transfer robot. Furthermore, the configuration prevents an increase of the atmospheric pressure in the body-side internal space and maintains the body-side internal space at a negative pressure, thereby suppressing dew condensation while suppressing leakage of particles from the body-side internal space. This configuration also enables the gas in the arm-side internal space to be discharged through the body-side internal space. This enables the entire transfer robot to be maintained at a negative pressure and suppresses leakage of particles from the internal space of the transfer robot.

According to a second aspect, the carrier device of the first aspect may further comprise a supply amount controller configured to control a supply amount of the gas that is to be supplied to the arm-side internal space. The supply amount controller may perform on/off control of a supply of the gas to the arm-side internal space and/or control of the supply amount of the gas to the arm-side internal space, according to an atmospheric pressure of an external environment of the transfer robot or a discharge amount by the exhaust unit. The gas supply unit may include a supply amount controller configured to control the supply amount of the gas. When the supply amount of the gas is made variable, the supply amount controller may be provided with a control valve to enable the supply amount of the gas that is to be supplied to the internal space in the arm-side base portion of the end effector and/or the leading end portion of the arm to be regulated with high accuracy.

When the supply amount of the gas is not made variable, an orifice may be provided in place of the control valve. This configuration enables the supply amount of the gas that is to be supplied to the internal space in the arm-side base portion of the end effector and/or the leading end portion of the arm to be regulated appropriately by the orifice. When the supply amount of the gas from a gas supply source is fixed, an orifice may be provided to regulate the supply amount of the gas that is to be supplied to the internal space, to a desired supply amount. This enables the supply amount of the gas to be regulated appropriately. This configuration may omit the control valve to reduce the cost. An orifice may be used in combination with a control valve. This configuration expands the regulation range of the flow rate and is likely to improve the regulation accuracy. As described above, the configuration of providing the supply amount controller regulates the supply amount of the gas with high accuracy and enables the gas to be supplied with such a supply amount that suppresses or prevents dew condensation in the internal space of the transfer robot and suppresses or prevents leakage of particles from the internal space of the transfer robot.

According to a third aspect, in the carrier device of either the first aspect or the second aspect, the body may be configured to move in a vertical direction and rotate in a horizontal direction by a lifting device and a rotating device. This configuration enables the transfer robot including the body to access each module that may have a two- or more-stage module configuration, thus shortening the cycle time and reducing the overall footprint of the system.

According to a fourth aspect, in the carrier device of any one of the first aspect to the third aspect, the exhaust unit may be provided with an ejector that is in fluid connection with the gas supply unit. This configuration enables the gas from the gas supply unit to be used as a driving fluid of the ejector and enables an internal space of the carrier device to be evacuated by the ejector. This configuration can simplify the exhaust unit without separately providing a gas supply source for driving the ejector.

According to a fifth aspect, in the carrier device of any one of the first aspect to the fourth aspect, the end effector may include a chuck mechanism configured to press and hold the work by a pressing member that is moved by a cylinder. The gas supply unit may supply part of the gas that is to be supplied to the cylinder, to the arm-side internal space. This configuration uses an existing gas supply pathway for the chuck mechanism and does not need to separately provide a gas supply source and an external supply pathway for the gas supply unit. There is also no need to modify a housing of the carrier device for connection of the external supply pathway for the gas supply unit.

According to a sixth aspect, in the carrier device of any one of the first aspect to the fifth aspect, the gas supply unit may include a flexible pipe that is placed in the carrier device. This configuration uses the flexible pipe to enhance the flexibility in the layout of an inlet and outlet of the gas in the carrier device.

According to a seventh aspect, the carrier device of any one of the first aspect to the sixth aspect may be a type of conveying the work in a wet environment. This configuration suppresses dew condensation in the internal space of the carrier device in the case of conveyance in the wet environment where the internal space of the carrier device is likely to fall into a state of high humidity.

According to an eighth aspect, in the carrier device of any one of the first aspect to the seventh aspect, the gas supply unit may supply a gas including dry air and/or nitrogen. This configuration enables the humidity in the internal space of the carrier device to be effectively reduced by the gas including the dry air and/or nitrogen.

According to a ninth aspect, the carrier device of any one of the first aspect to the eighth aspect may be placed in a work processing apparatus to be in fluid connection with a utility line of the work processing apparatus. The gas supply unit may receive a supply of the gas from the utility line. This configuration uses the gas from the existing utility line of the work processing apparatus. There is accordingly no need to separately provide a gas supply source. This configuration is thus likely to suppress complication of piping and/or reduce a cost increase. Moreover, the configuration of directly introducing the gas from an external gas supply source into the arm-side internal space is highly effective for regulating the humidity.

According to a tenth aspect, the carrier device of any one of the first aspect to the ninth aspect may be a multi-joint robot that includes the end effector and at least one arm unit connected with each other and that is configured such that an internal space of the end effector and an internal space of the at least one arm unit are in fluid communication with each other. Since the internal spaces are in fluid communication with each other, this configuration enables the gas introduced into any of the internal spaces to be supplied to the plurality of internal spaces and suppresses dew condensation.

According to an eleventh aspect, there is provided a work processing apparatus comprising the carrier device of any one of the first aspect to the tenth aspect; and a work processing module configured to process the work conveyed by the carrier device. According to this aspect, the functions and advantageous effects described above are performed in the carrier device included in the work processing apparatus.

According to a twelfth aspect, in the work processing apparatus of the eleventh aspect, the carrier device may transfer the work in a wet environment to/from the work processing module that performs work processing. This configuration suppresses dew condensation of the internal space of the carrier device in the case of transferring the work in the wet environment that is likely to cause the internal space of the carrier device to fall into a state of high humidity.

According to a thirteenth aspect, there is provided a control method of a carrier device of a work. The control method comprises a gas supply process of supplying a gas to an arm-side internal space provided in an arm-side base portion of an end effector and/or in a leading end portion of an arm; a supply amount control process of controlling a supply amount of the gas that is to be supplied to the arm-side internal space; and an exhaust process of discharging a gas in the arm-side internal space and/or in a body-side internal space that communicates with the arm-side internal space. The supply amount control process includes a control process of performing on/off control of a supply of the gas to the arm-side internal space and/or control of the supply amount of the gas to the arm-side internal space, according to an atmospheric pressure of an external environment of the carrier device or a discharge amount in the exhaust process. This configuration has similar functions and advantageous effects to those of the second aspect described above.

According to a fourteenth aspect, there is provided a non-volatile storage medium configured to store a program that operates a computer to perform a control method of a carrier device of a work. The program comprises a process of performing on/off control of a supply of the gas to the arm-side internal space and/or control of the supply amount of the gas to the arm side internal space, according to an atmospheric pressure of an external environment of the carrier device or a discharge amount by the exhaust unit. This configuration has similar functions and advantageous effects to those of the second aspect described above.

Although the embodiments of the present invention have been described based on some examples, the embodiments of the invention described above are presented to facilitate understanding of the present invention, and do not limit the present invention. The present invention can be altered and improved without departing from the subject matter of the present invention, and it is needless to say that the present invention includes equivalents thereof. In addition, it is possible to arbitrarily combine or omit respective constituent elements described in the claims and the specification in a range where at least a part of the above-mentioned problem can be solved or a range where at least a part of the effect is exhibited.

REFERENCE SIGNS LIST 1 housing
2 loading/unloading module
3 polishing module
3A, 3B, 3C, 3D polishing units
4 cleaning module
5 controller
6 first linear transporter
7 second linear transporter
10 polishing pad
11 lifter
12 swing transporter
20 front loading units
21 traveling mechanism
22 transfer robot
30A, 30B, 30C, 30D polishing tables
31A, 31B, 31C, 31D top rings
32A, 32B, 32C, 32D polishing liquid supply mechanisms
33A, 33B, 33C, 33D dressers
34A, 34B, 34C, 34D atomizers
72 temporary placing table
73 primary cleaner
74 secondary cleaner
75 dryer
77 first transfer robot
78 second transfer robot
80 inline film thickness measuring instrument
702 body
702a opening
702b gap
703 rotational part
704 first arm
704a, 704c covers
704b, 704d O rings
705 second arm
705a, 705c covers
705b, 705d O rings
706 end effector
706a end effector base end portion
706b end effector holding portion
706c, 706d claws
710, 710A supply lines
720 gas supply unit
721, 722 supply lines
723 supply port
724 supply amount controller
730 exhaust unit
731 exhaust line
731a exhaust port
734 driving fluid supply line
732 ejector
733 filter
740 exhaust line
741 silencer
750 driving fluid supply unit
751, 752 drive lines
753a advance-side drive line
753b retreat-side drive line
754 switching valve
755 chuck mechanism
755a cylinder
755b shaft
755c pressing member
770 gas supply source

What is claimed is:
1. A carrier device, comprising:
a body;
a rotational part provided to be rotatable relative to the body;
an arm supported on the rotational part;
an end effector provided in a leading end portion of the arm and configured to hold a work;
a gas supply unit comprising at least one of a gas supply line or a supply port configured to supply a gas to an arm-side internal space and outside an actuator for driving the end effector to fill the arm-side internal space with the gas, the arm-side internal space provided in an arm-side base portion of the end effector and/or in the leading end portion of the arm; and
an exhaust unit provided in a body-side internal space that communicates with the arm-side internal space and configured to discharge the gas filled in the arm-side internal space and/or in the body-side internal space.
2. The carrier device according to claim 1, further comprising
a supply amount controller configured to control a supply amount of the gas that is to be supplied to the arm-side internal space, the supply amount controller including at least one of a flow control valve, an on-off valve or an orifice, wherein
the supply amount controller is configured to perform on/off control of a supply of the gas to the arm-side internal space and/or control of the supply amount of the gas to the arm-side internal space, according to an atmospheric pressure of an external environment of the carrier device or a discharge amount by the exhaust unit.
3. The carrier device according to either claim 1,
wherein the body is configured to move in a vertical direction and rotate in a horizontal direction.
4. The carrier device according to claim 1,
wherein the exhaust unit is provided with an ejector that is in fluid connection with the gas supply unit.

5. The carrier device according to claim 1,
wherein the actuator comprises a cylinder, and the end effector includes a chuck mechanism configured to be driven by the cylinder to press and hold the work, and
the gas supply unit supplies part of the gas that is to be supplied to the cylinder, to the arm-side internal space.

6. The carrier device according to claim 1,
wherein the gas supply unit includes a flexible pipe that is placed in the carrier device.

7. The carrier device according to any one of claim 1,
wherein the carrier device conveys the work in a wet environment.

8. The carrier device according to any one of claim 1,
wherein the gas supply unit supplies a gas including dry air and/or nitrogen.

9. The carrier device according to any one of claim 1,
wherein the carrier device is placed in a work processing apparatus to be in fluid connection with a utility line of the work processing apparatus, and
wherein the gas supply unit receives a supply of the gas from the utility line.

10. The carrier device according to claim 1,
wherein the carrier device is a multi-joint robot that includes the end effector and at least one arm unit and is configured such that an internal space of the end effector and an internal space of the at least one arm unit are in fluid communication with each other.

11. A work processing apparatus, comprising:
a carrier device, comprising: a body; a rotational part provided to be rotatable relative to the body; an arm supported on the rotational part; an end effector provided in a leading end portion of the arm and configured to hold a work; a gas supply unit comprising at least one of a gas supply line or a supply port configured to supply a gas to an arm-side internal space and outside an actuator for driving the end effector, to fill the arm-side internal space with the gas, the arm-side internal space provided in an arm-side base portion of the end effector and/or in the leading end portion of the arm; and an exhaust unit provided in a body-side internal space that communicates with the arm-side internal space and configured to discharge the gas filled in the arm-side internal space and/or in the body-side internal space; and
a work processing module configured to process the work conveyed by the carrier device.

12. The work processing apparatus according to claim 11,
wherein the carrier device transfers the work in a wet environment to/from the work processing module that performs work processing.

13. A control method of a carrier device of a work,
wherein the carrier device comprises a body; a rotational part provided to be rotatable relative to the body; an arm supported on the rotational part; and an end effector provided in a leading end portion of the arm and configured to hold a work,
the control method comprising:
a gas supply process of supplying a gas to an arm-side internal space and outside an actuator for driving the end effector to fill the arm-side internal space with the gas, the arm-side internal space provided in an arm-side base portion of the end effector and/or in the leading end portion of the arm;
a supply amount control process of controlling a supply amount of the gas that is to be supplied to the arm-side internal space; and
an exhaust process of discharging the gas filled in the arm-side internal space and/or a body-side internal space that communicates with the arm-side internal space,
wherein the supply amount control process comprises performing on/off control of a supply of the gas to the arm-side internal space and/or control of the supply amount of the gas to the arm-side internal space, according to an atmospheric pressure of an external environment of the carrier device or a discharge amount in the exhaust process.

14. A non-volatile storage medium configured to store a program that operates a computer to perform a control method of a carrier device of a work,
wherein the carrier device comprises a body; a rotational part provided to be rotatable relative to the body; an arm supported on the rotational part; an end effector provided in a leading end portion of the arm and configured to hold a work,
the program comprises:
a gas supply process of controlling a gas supply unit comprising at least one of a gas supply line or a supply port to supply a gas to an arm-side internal space and outside an actuator for driving the end effector to fill the arm-side internal space with the gas, the arm-side internal space provided in an arm-side base portion of the end effector and/or in the leading end portion of the arm;
a supply amount control process of controlling a supply amount controller to control a supply amount of the gas that is to be supplied to the arm-side internal space, the supply amount controller including at least one of a flow control valve, an on-off valve or an orifice; and
an exhaust process of controlling an exhaust unit to discharge the gas filled in the arm-side internal space and/or a body-side internal space that communicates with the arm-side internal space,
wherein the supply amount control process comprises performing on/off control of a supply of the gas to the arm-side internal space and/or control of the supply amount of the gas to the arm-side internal space, according to an atmospheric pressure of an external environment of the carrier device or a discharge amount by the exhaust unit.

15. A carrier device, comprising:
a body;
a rotational part provided to be rotatable relative to the body;
an arm supported on the rotational part;
an end effector provided in a leading end portion of the arm and configured to hold a work;
a gas supply unit comprising at least one of a gas supply line or a supply port configured to supply a gas to an arm-side internal space provided in an arm-side base portion of the end effector and/or in the leading end portion of the arm to fill the arm-side internal space with the gas to suppress dew condensation in the arm-side internal space and a body-side internal space that communicates with the arm-side internal space; and
an exhaust unit provided in the body-side internal space and configured to discharge the gas filled in the arm-side internal space and/or in the body-side internal space to suppress a leakage of particles from the arm-side internal space and the body-side internal space.

16. A work processing apparatus, comprising:
a carrier device, comprising: a body; a rotational part provided to be rotatable relative to the body; an arm supported on the rotational part; an end effector provided in a leading end portion of the arm and configured to hold a work; a gas supply unit comprising at least one of a gas supply line or a supply port configured to supply a gas to an arm-side internal space provided in an arm-side base portion of the end effector and/or in the leading end portion of the arm, to fill the arm-side internal space with the gas to suppress dew condensation in the arm-side internal space and a body-side internal space that communicates with the arm-side internal space; and an exhaust unit provided in the body-side internal space and configured to discharge the gas filled in the arm-side internal space and/or in the body-side internal space to suppress a leakage of particles from the arm-side internal space and the body-side internal space; and
a work processing module configured to process the work conveyed by the carrier device.

17. A control method of a carrier device of a work,
wherein the carrier device comprises a body; a rotational part provided to be rotatable relative to the body; an arm supported on the rotational part; and an end effector provided in a leading end portion of the arm and configured to hold a work,
the control method comprising:
a gas supply process of supplying a gas to an arm-side internal space provided in an arm-side base portion of the end effector and/or in the leading end portion of the arm, to fill the arm-side internal space with the gas to suppress dew condensation in the arm-side internal space and a body-side internal space that communicates with the arm-side internal space;
a supply amount control process of controlling a supply amount of the gas that is to be supplied to the arm-side internal space; and
an exhaust process of discharging the gas filled in the arm-side internal space and/or the body-side internal space to suppress a leakage of particles from the arm-side internal space and the body-side internal space,
wherein the supply amount control process comprises performing on/off control of a supply of the gas to the arm-side internal space and/or control of the supply amount of the gas to the arm-side internal space, according to an atmospheric pressure of an external environment of the carrier device or a discharge amount in the exhaust process.

18. A non-volatile storage medium configured to store a program that operates a computer to perform a control method of a carrier device of a work,
wherein the carrier device comprises a body; a rotational part provided to be rotatable relative to the body; an arm supported on the rotational part; an end effector provided in a leading end portion of the arm and configured to hold a work,
the program comprises:
a gas supply process of controlling a gas supply unit comprising at least one of a gas supply line or a supply port to supply a gas to an arm-side internal space provided in an arm-side base portion of the end effector and/or in the leading end portion of the arm, to fill the arm-side internal space with the gas to suppress dew condensation in the arm-side internal space and a body-side internal space that communicates with the arm-side internal space;
a supply amount control process of controlling a supply amount controller to control a supply amount of the gas that is to be supplied to the arm-side internal space, the supply amount controller including at least one of a flow control valve, an on-off valve or an orifice; and
an exhaust process of controlling an exhaust unit to discharge the gas filled in the arm-side internal space and/or the body-side internal space to suppress a leakage of particles from the arm-side internal space and the body-side internal space,
wherein the supply amount control process comprises performing on/off control of a supply of the gas to the arm-side internal space and/or control of the supply amount of the gas to the arm-side internal space, according to an atmospheric pressure of an external environment of the carrier device or a discharge amount by the exhaust unit.

* * * * *